(12) United States Patent
Ebihara

(10) Patent No.: US 6,822,499 B2
(45) Date of Patent: Nov. 23, 2004

(54) CLOCK MODULATING CIRCUIT

(75) Inventor: Hirofumi Ebihara, Miyazaki (JP)

(73) Assignee: Oki Electric Industry Co., Ltd., Tokyo (JP)

(*) Notice: Subject to any disclaimer, the term of this patent is extended or adjusted under 35 U.S.C. 154(b) by 165 days.

(21) Appl. No.: 10/303,838

(22) Filed: Nov. 26, 2002

(65) Prior Publication Data

US 2003/0227335 A1 Dec. 11, 2003

(30) Foreign Application Priority Data

Jun. 11, 2002 (JP) .................................... 2002-169853

(51) Int. Cl.[7] .............................. G06F 1/04; H03K 3/00
(52) U.S. Cl. ...................... 327/294; 327/291; 327/293; 327/299
(58) Field of Search ................................ 327/291, 293, 327/294, 298, 299

(56) References Cited

U.S. PATENT DOCUMENTS 6,518,813 B1 * 2/2003 Usui ........................... 327/291

FOREIGN PATENT DOCUMENTS

JP 62-063327 3/1987

* cited by examiner

*Primary Examiner*—David Mis
(74) *Attorney, Agent, or Firm*—Volentine Francos & Whitt, PLLC (57) ABSTRACT

A clock modulating circuit includes a first to nth delay circuits, a selection signal generator and a selection circuit. The first delay circuit receives an original clock signal and outputs a delayed clock signal. The second to nth delay circuits receive the delayed signal output from the preceding delay circuit and output delayed clock signals. The selection signal generator outputs a selection signal in response to the original clock signal. The selection signal has an instruction for selecting in ascending order from the first to nth delay circuits and then in descending order from the nth to first delay circuits. The selection circuit is connected to the first to nth delay circuits and the selection signal generator. The selection circuit receives the delayed signals from the first to nth delay circuits and outputs one of the delayed clock signals in response to the selection signal.

18 Claims, 6 Drawing Sheets

CLOCK MODULATING CIRCUIT

BACKGROUND OF THE INVENTION

1. Field of the Invention

The present invention relates to a clock modulating circuit which is used in a clock input such as a microcontroller unit (hereinafter called "MCU") or the like and reduces radiant noise synchronized with an original oscillation frequency.

2. Description of the Related Art

An MCU has been widely used in various control of a vehicle. With the speeding up of the MCU in recent years, radiant noise generated from the MCU is superimposed on an FM frequency band and exerts a bad influence on a car radio or the like. As one countermeasure against it, there has been used a method of modulating an original oscillation clock and dispersing radiant noise generated in synchronism with an original oscillation frequency (e.g., Japanese Patent Application Laid-Open No. Sho 62(1987)-63327, etc.).

Japanese Patent Application Laid-Open No. Sho 62(1987)-63327 has disclosed the following method. Since a specific harmonic is generated as noise when the frequency of a fundamental wave fo is fixed to a constant value, the frequency of the fundamental wave fo is modulated at random within a range that exerts no influence on the control accuracy of an MCU. Further, a high-frequency spectrum is dispersed to reduce respective crest values. The influence of the high-frequency noise on the outside is reduced in this way. The frequency of the fundamental wave fo is modulated on a random number basis in a read/write cycle of the MCU. A circuit for modulating the original oscillation clock is made up of a delay circuit having a plurality of delay elements connected in series and switches for respectively selecting any of the delay elements every pulses.

A pulse of the original oscillation clock is supplied from the delay element selected from the plurality of delay elements by the corresponding switch. This switch is controlled by a shift register constructed using a plurality of flip-flop circuits. The selected delay element varies for each pulse of the original oscillation clock and a plurality of the switches are turned ON in order. The rising edges of outputted pulses are modulated so that a high-frequency spectrum is dispersed.

In the conventional method, however, the rising edge of each pulse of the original oscillation clock is modulated, whereas the falling edge thereof remains fixed. Therefore, the conventional method is accompanied by a problem that when a circuit synchronized with the rising edge of the clock and a circuit synchronized with the falling edge of the clock exist in the MCU or the like in mixed form, the effect of reducing radiant noise is degraded. This is because no radiant noise is dispersed in the circuit synchronized with the falling edge thereof.

In the conventional method as well, the ratio between an "H" interval and an "L" interval of a modulated clock, i.e., a duty ratio changes. Therefore, a problem arises in that the conventional method cannot be applied to an MCU including a circuit dependent on a duty ratio, e.g., a circuit having no margin during an "H" interval of a clock, etc.

SUMMARY OF THE INVENTION

The present invention may provide a clock modulating circuit which does not degrade the effect of reducing radiant noise even where a circuit synchronized with the rising edge of a clock and a circuit synchronized with the falling edge of the clock exist in mixed form.

Further, the present invention may provide a clock modulating circuit applicable even to an MCU or the like including a circuit dependent on a duty ratio.

A clock modulating circuit of the present invention includes a first to nth delay circuits, a selection signal generator and a selection circuit. The first delay circuit receives an original clock signal and outputs a delayed clock signal. The second to nth delay circuits receive the delayed signal output from the preceding delay circuit and output delayed clock signals. The selection signal generator outputs a selection signal in response to the original clock signal. The selection signal has an instruction for selecting in ascending order from the first to nth delay circuits and then in descending order from the nth to first delay circuits. The selection circuit is connected to the first to nth delay circuits and the selection signal generator. The selection circuit receives the delayed signals from the first to nth delay circuits and outputs one of the delayed clock signals in response to the selection signal.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Several embodiments of the present invention will hereinafter be described using the accompanying drawings. Incidentally, elements of structure each having substantially the same function and configuration in the present specification and drawings are respectively identified by the same reference numerals and the description of certain common elements will therefore be omitted.

Figure 1:
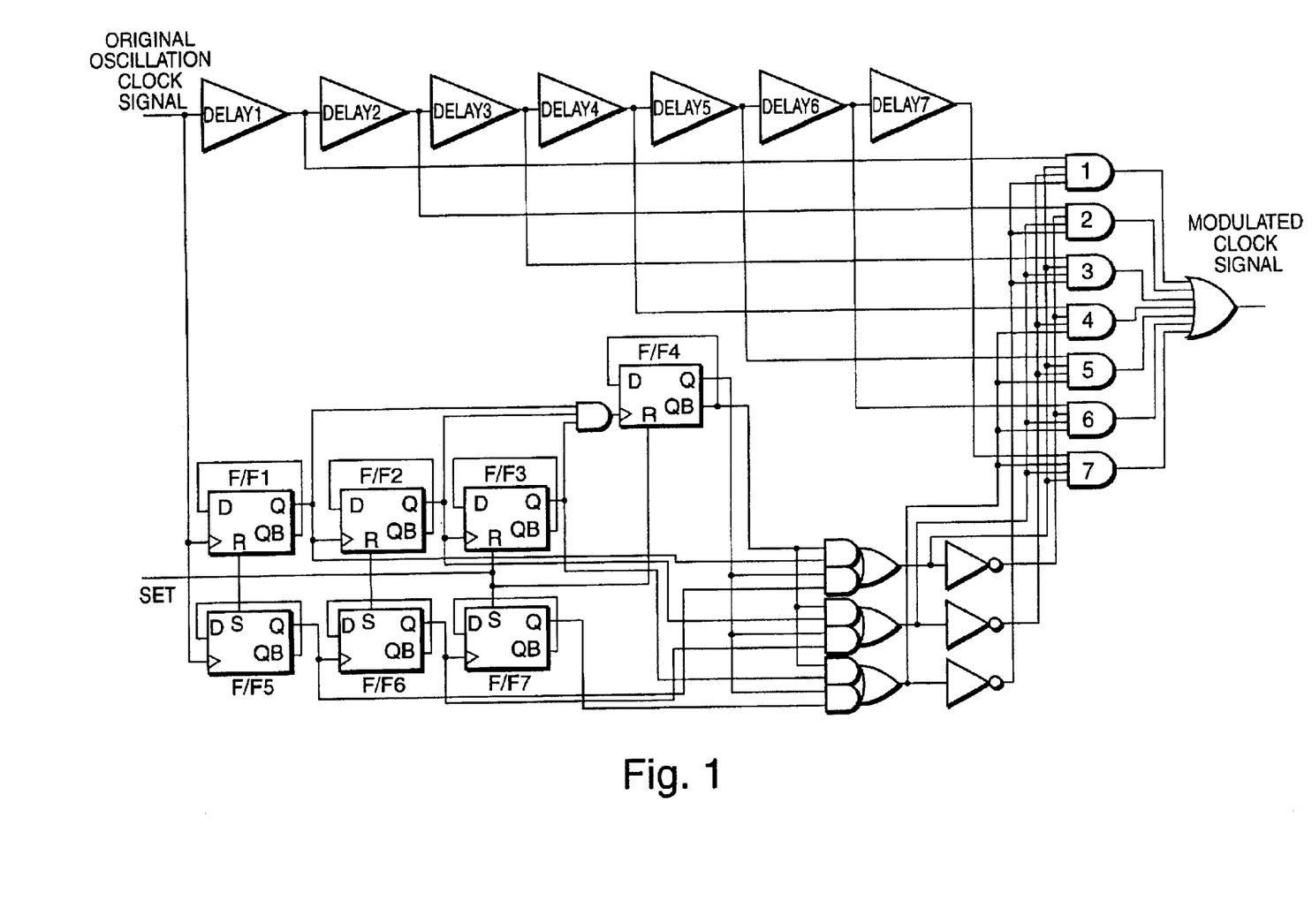
FIG. 1 is a logic circuit diagram showing a configuration of a clock modulating circuit according to a first embodiment.

FIG. 1 is a logic circuit diagram showing a configuration of a clock modulating circuit according to a first embodiment. In the first embodiment, delay elements or delays for producing outputs with being delayed predetermined times with respect to an input pulse are connected in series in the form of first to seventh stages (Delays 1 through 7). An original oscillation clock is inputted to the first delay (Delay 1), and clock outputs (hereinafter called "Q outputs") respectively outputted with being delayed predetermined times with respect to the input clock are sequentially inputted to next-stage delay elements (Delays 2 through 7).

The outputs of the delay elements (Delays 1 through 7) are inputted to their corresponding AND logical elements 1 through 7. If all the inputs of the AND logical elements are turned ON, then they output the corresponding pulses of the delay elements connected thereto. Therefore, other signals connected to the AND logical elements 1 through 7 are controlled so that the delay elements for the pulses each outputted to a modulated clock are selected every pulses.

In order to select the delay elements (Delays 1 through 7), an up-counter comprised of flip-flop elements (F/F1 through F/F3) of three stages connected to one another as shown in FIG. 1, and a down-counter comprised of flip-flop elements (F/F5 through F/F7) of three stages connected to one another as shown in FIG. 1 in like fashion are used.

Owing to the circuit configuration shown in FIG. 1, the up-counter comprised of the flip-flop elements (F/F1 through F/F3) and the down-counter comprised of the flip-flop elements (F/F5 through F/F7) respectively perform count operations of 0 to 7 or 7 to 0. The flip-flop element (F/F4) repeatedly produces an "H" level output and an "L" level output as a Q output thereof each time the up-counter performs 7 counts. When the Q output is of the "L" level output, the count value of the up-counter is selected. On the other hand, when the Q output is of the "H" level output, the count value of the down-counter is selected. Such counter-selected values correspond to the numbers 1 to 7 of the AND logical elements.

Thus, the counter-selected value varies for each clock in the original oscillation clock. As a modulated clock at the time that the counter-selected value is 1, a waveform of an output produced from the delay element (Delay 1) is selected with respect to the original oscillation clock. When the counter-selected value goes up to 7 in ascending order, the Q output of the flip-flop element (F/F4) changes from the "L" level output to the "H" level output. Thus, the up-counter is switched to the down-counter, so that the counter-selected value is selected from 7 in descending order.

Thus, the delay elements (Delays 1 through 7) of seven stages are selected in ascending order from the delay element (Delay 1) to the delay element (Delay 7) during a period of from the input of a set signal to the input of a next set signal. Next, the delay elements are selected in descending order from the delay element (Delay 7) to the delay element (Delay 1). They are selected again in ascending order from the delay element (Delay 1) to the delay element (Delay 7). This is sequentially repeated. As the modulated clocks, clocks modulated in order of the delay elements Delays 1 through 7, and the delay elements Delays 7 through 1 are outputted.

Figure 2:
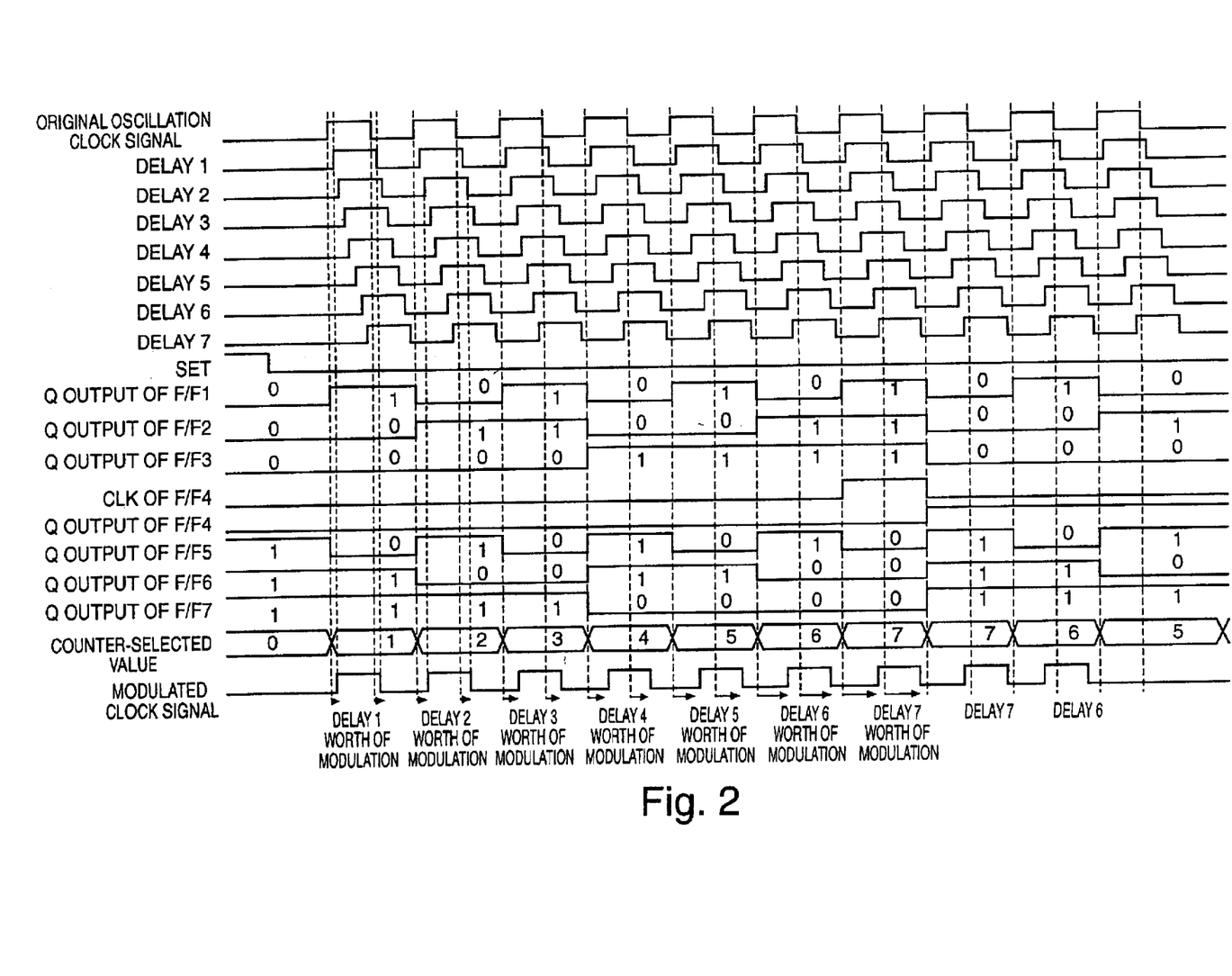
FIG. 2 is a time chart of the clock modulating circuit according to the first embodiment.

FIG. 2 is a time chart showing ten cycles of the original oscillation clock, which is related to the clock modulating circuit according to the first embodiment. There are shown the original oscillation clock, outputs of the Delays 1 through 7, a SET signal, a Q output of the F/F1, a Q output of the F/F2, a Q output of the F/F3, a clock of the F/F4, a Q output of the F/F5, a Q output of the F/F6, a Q output of the F/F7, a counter-selected value, and a modulated clock in order from above. The modulated clock changes on the delay element's worth of rising/falling edges with respect to the original oscillation clock. During an "H" interval of the clock, an output is produced in which a duty ratio is fixed.

As described above, the modulation is taken on the rising/falling edges of the clock in the clock modulating circuit according to the first embodiment, whereby radiant noise can be reduced even when circuits synchronized on the rising/falling edges of the clock exist in mixed form. By fixing the "H" interval of the clock, the present embodiment can be applied even to a circuit dependent on the duty ratio.

Figure 3:
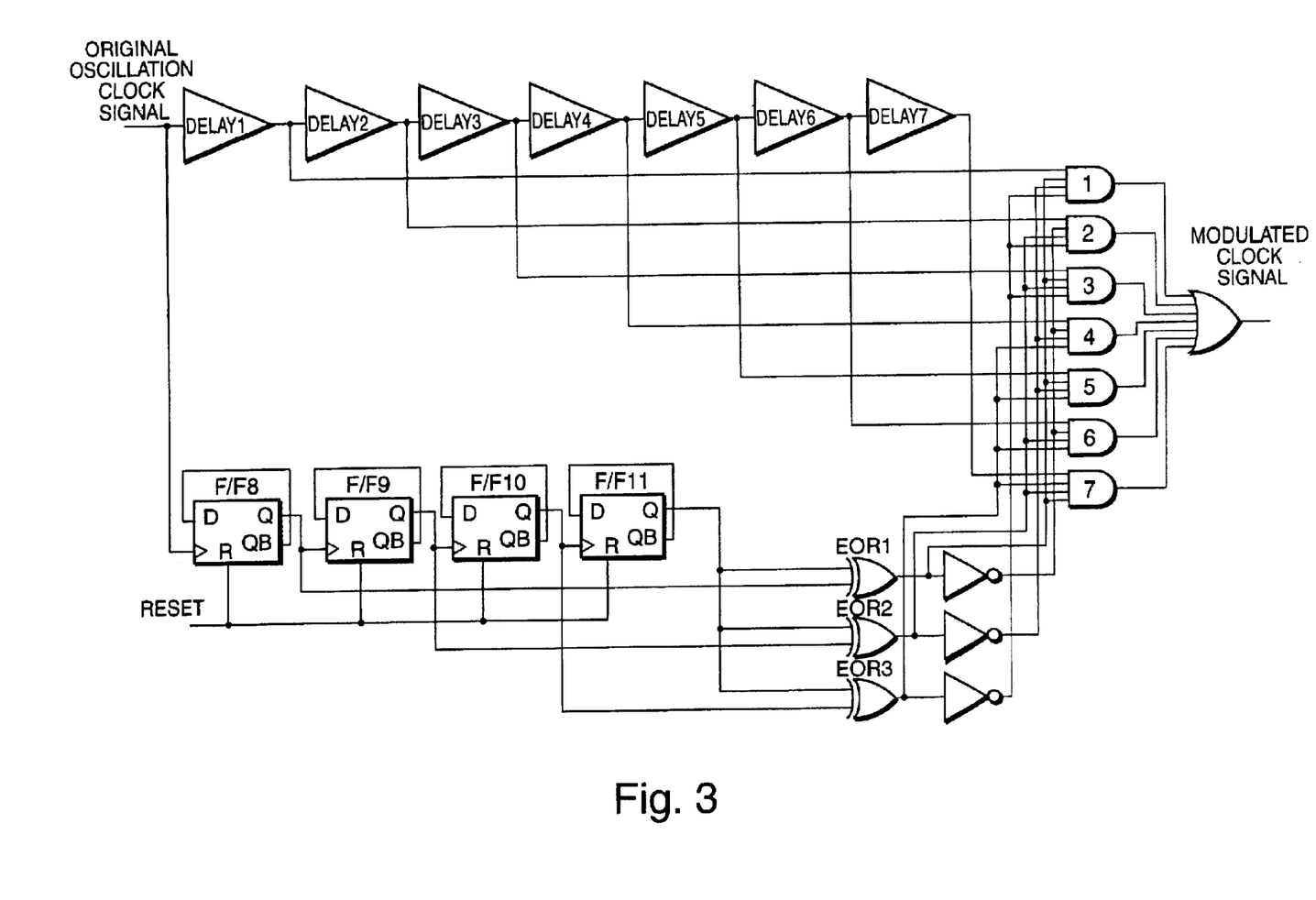
FIG. 3 is a logic circuit diagram illustrating a configuration of a clock modulating circuit according to a second embodiment.

FIG. 3 is a logic circuit diagram showing a configuration of a clock modulating circuit according to a second embodiment. In a second embodiment, delay elements for producing outputs with being delayed predetermined times with respect to an input pulse are connected in series in the form of seven stages corresponding to the first to seventh stages in a manner similar to the first embodiment (Delays 1 through 7). An original oscillation clock is inputted to the delay element (Delay 1), and Q outputs respectively outputted with being delayed predetermined times from the input are sequentially inputted to their corresponding next-stage delay elements (Delays 2 through 7). Outputs produced from the series-connected delay elements (Delays 1 through 7) inputted with the original oscillation clock are selected every pulses so that the original oscillation clock is modulated.

In the second embodiment, the outputs are inputted to their corresponding AND logical elements. Signals for selecting the delay elements are supplied using flip-flop elements of three stages (F/F8 through F/F11) connected as shown in FIG. 3, and three EOR logical elements (non-coincidence circuit elements) (EOR1 through EOR3). A Q output of the F/F11 and Q outputs of the F/F8, F/F9 and F/F10 are respectively inputted to the EOR logical elements (EOR1 through EOR3), where counter-selected values are set.

A description will be made of such a counter select operation. The F/F8 through F/F11 constitute an up-counter, which counts up from 0. At this time, the Q output of the F/F11 remains at an "L" level until the counter performs 7 counts, and the Q outputs of the F/F8, F/F9 and F/F10 are outputted as the outputs of the EOR1 through EOR3 as they are. Therefore, the up-counted values are set. Since the Q output of the F/F11 changes to an "H" level when the count reaches 7 to 8, the inverted values of the Q outputs of the F/F8, F/F9 and F/F10, i.e., down-counted values are next set as the outputs of the EOR1 through EOR3. Thus, they are operated line counters for sequentially counting up/down the values of the EOR1 through EOR3 according to the output of the F/F11.

Thus, the delay elements (Delays 1 through 7) of seven stages are selected in ascending order from the delay element (Delay 1) to the delay element (Delay 7) during a period of from the input of a reset signal to the input of a next reset signal. Next, the delay elements are selected in descending order from the delay element (Delay 7) to the delay element (Delay 1). They are selected again in ascending order from the delay element (Delay 1) to the delay element (Delay 7). This is sequentially repeated. As modulated clocks, clocks modulated in order of the delay elements Delays 1 through 7, and the delay elements Delays 7 through 1 are outputted.

Figure 4:
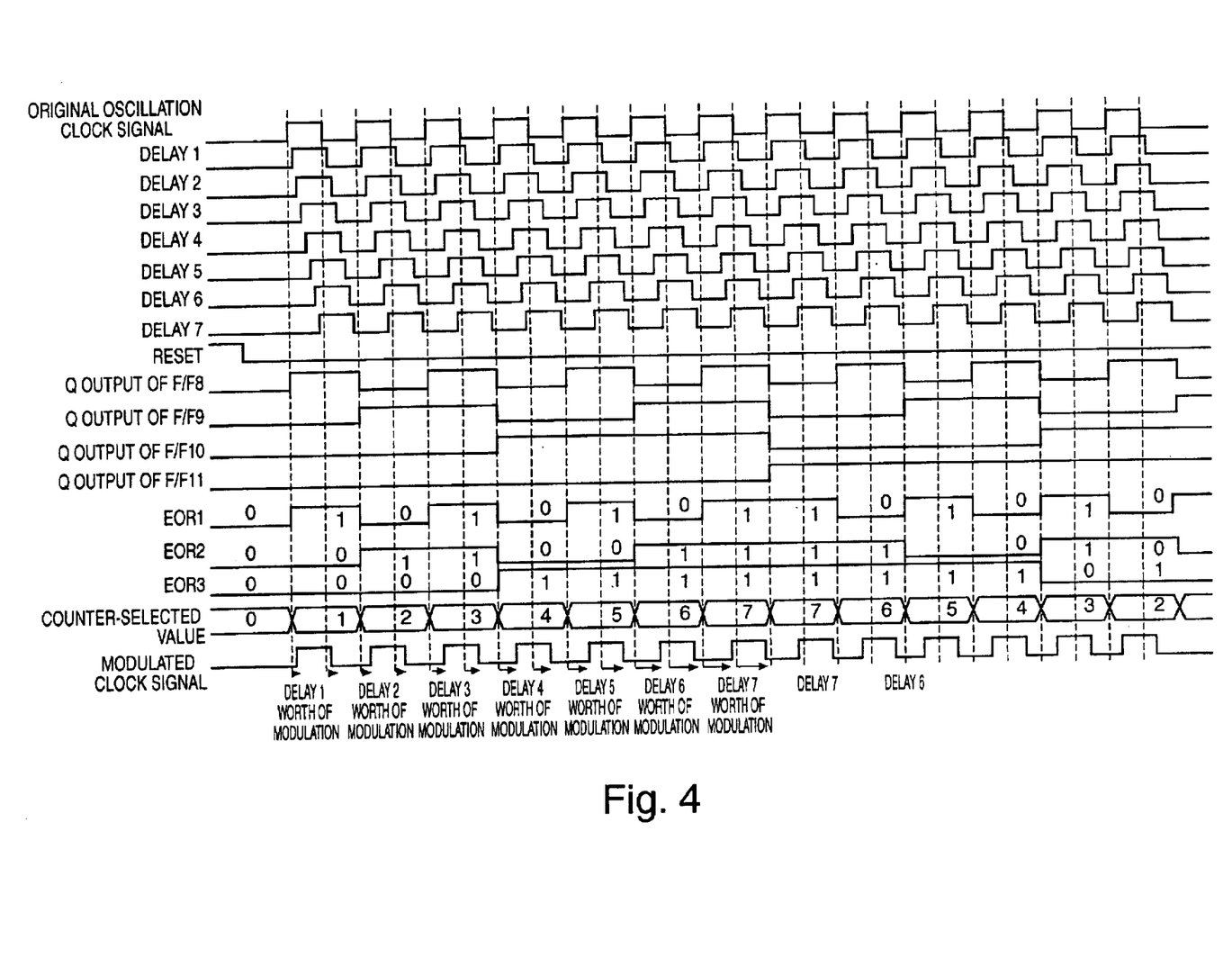
FIG. 4 is a time chart of the clock modulating circuit according to the second embodiment.

FIG. 4 is a time chart showing ten cycles of the original oscillation clock, which is related to the clock modulating circuit according to the second embodiment. There are shown the original oscillation clock, outputs of the Delays 1 through 7, a RESET signal, a Q output of the F/F8, a Q output of the F/F9, a Q output of the F/F10, a clock of the F/F11, an output of the EOR1, an output of the EOR2, an output of the EOR3, a counter-selected value, and a modulated clock in order from above. In a manner similar to the first embodiment, the pulse outputs are selected in order of the delay elements Delays 1 through 7 and the delays 7 through 1, whereby a modulated clock is outputted. The modulated clock changes on the delay element's worth of rising/falling edges with respect to the original oscillation clock. During an "H" interval of the clock, an output is given in which a duty ratio is fixed.

As described above, the original oscillation clock is modulated by the up-counter and the EOR logical elements used as an alternative to the up-counter and the down-counter in the clock modulating circuit according to the second embodiment, whereby an advantageous effect similar to the first embodiment is obtained on a circuit scale smaller than that for the first embodiment.

Figure 5:
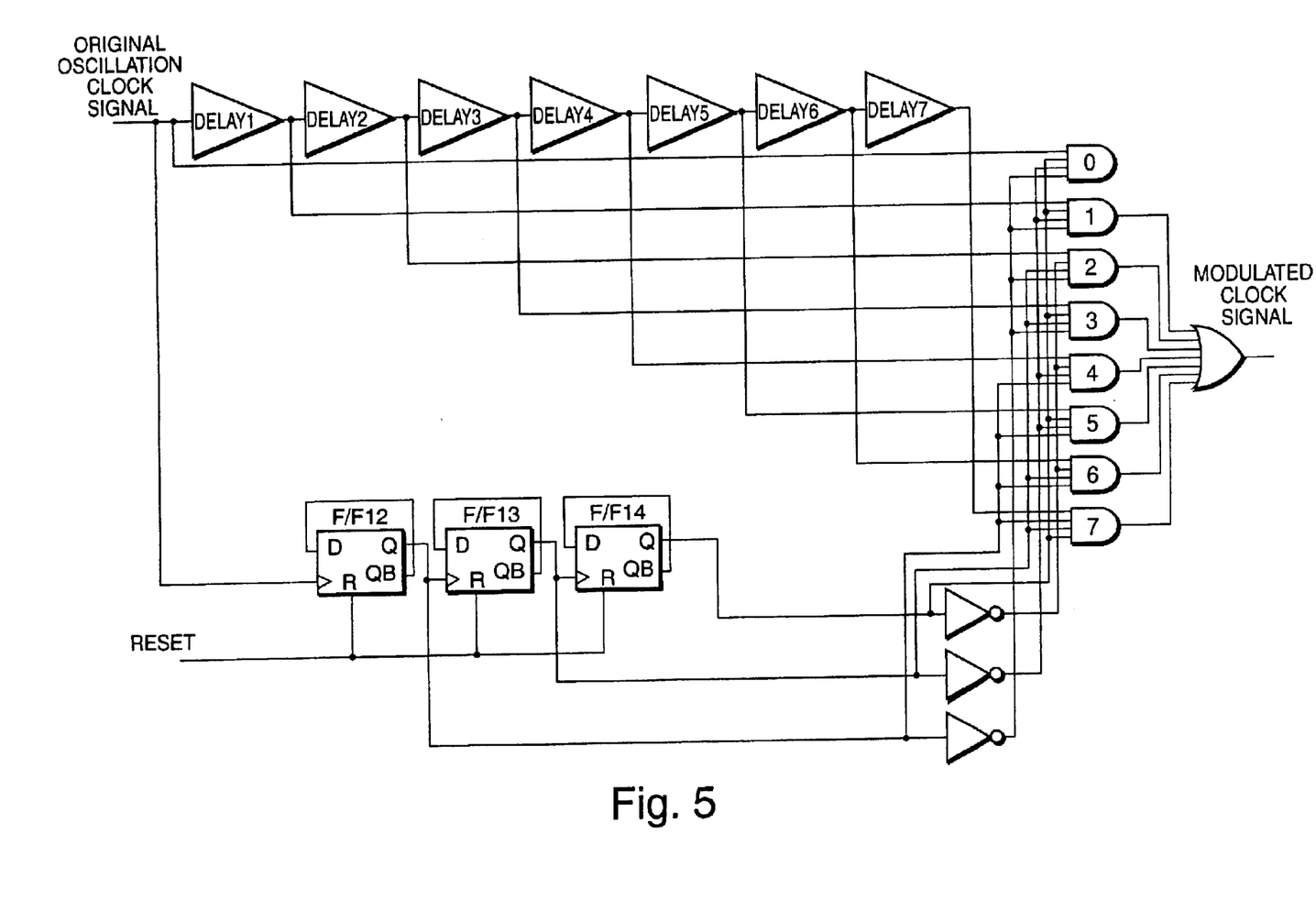
FIG. 5 is a logic circuit diagram depicting a configuration of a clock modulating circuit according to a third embodiment.

FIG. 5 is a logic circuit diagram showing a configuration of a clock modulating circuit according to a third embodiment. In the third embodiment in a manner similar to the first embodiment, delay elements, which produce outputs with being delayed predetermined times with respect to an input pulse, are connected in series in the form of seven stages corresponding to the first to seventh stages (Delays 1 through 7). An original oscillation clock is inputted to the delay element (Delay 1), and Q outputs respectively outputted with being delayed predetermined times from the input are sequentially inputted to their corresponding next-stage delay elements (Delays 2 through 7).

Thus, in the third embodiment, the delay elements (Delays 1 through 7) of seven stages are selected in ascending order from the delay element (Delay 1) to the delay element (Delay 7) during a period of from the input of a reset signal to the input of a next reset signal. This is sequentially repeated. As modulated clocks, clocks modulated in order of the delay elements Delays 1 through 7 are outputted. An up-counter comprised of three-stage flip-flop elements connected in series is used to select the delay elements.

Signals inputted to AND logical elements 1 through 7 corresponding to the delay elements Delays 1 through 7 to select the delay elements Delays 1 through 7 are supplied by the up-counter comprised of the three-stage flip-flop elements (F/F12, F/F13, and F/F14) connected as shown in FIG. 5. A counter-selected value is set by the up-counter for each clock of the original oscillation clock. Delay element values are selected in ascending order according to the counter-selected values, and clocks modulated in order of the delay elements Delays 1 through 7 are outputted.

Figure 6:
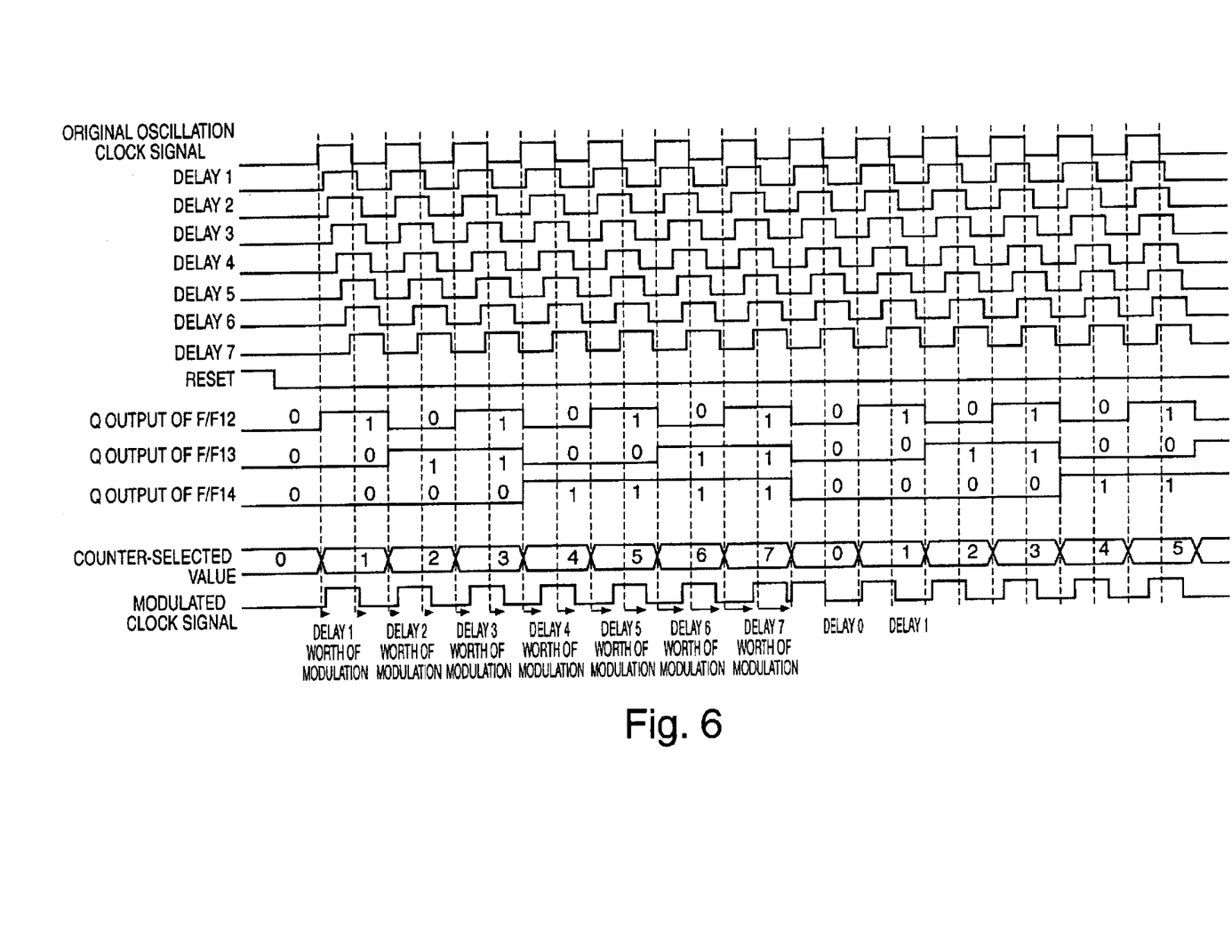
FIG. 6 is a time chart of the clock modulating circuit according to the third embodiment.

FIG. 6 is a time chart showing ten cycles of the original oscillation clock, which is related to the clock modulating circuit according to the third embodiment. There are shown in order from above, the original oscillation clock, outputs of the Delays 1 through 7, a RESET signal, a Q output of the F/F12, a Q output of the F/F13, a Q output of the F/F14, a counter-selected value, and a modulated clock. The modulated clock changes on the delay element's worth of rising/falling edges with respect to the original oscillation clock.

In the clock modulating circuit according to the third embodiment, the pulse outputs are selected in ascending order from the delay elements Delays 1 to 7 to output the corresponding modulated clock. Since the duty ratio changes when the up-counter is changed from the count 7 to the count 1, the third embodiment is a system effective in using a circuit that might not be conscious of its operating speed and duty ratio. As compared with the configurations of the first and second embodiments, the present embodiment can be realized on a smaller circuit scale. Modulation is taken on the rising/falling edges of the clock in a manner similar to the first and second embodiments, so that radiant noise can be reduced even when circuits synchronized on the rising/falling edges of the clock exist in mixed form.

While the first through third embodiments respectively have described the case where the delay elements are configured in the form of the seven stages (n=7), the present invention is not limited to it. Although an advantageous effect is brought about when the number of stages n of the delay elements is three or more, a circuit configuration becomes complex when the number of stages n exceeds 100. Thus, the number of such stages is not undesirable. Since the counter easily obtains two factorial, for example, 3, 7, 15, 31, 63, etc. can be adopted as the number of stages n of the delay elements. The modulating clock circuit of the present invention is by no means limited to an application to the MCU.

While the preferred embodiments of the clock modulating circuit of the present invention have been described above with reference to the accompanying drawings, the present invention is not limited to these examples. It will be apparent to those skilled in the art that various changes and modifications can be supposed to be made to the invention within the scope of a technical idea described in the following claims. It is understood that those should also fall within the technical scope of the present invention.

According to the present invention as described above, there can be provided a clock modulating circuit employed in a MCU or the like, wherein even when circuits synchronized on the rising/falling edges of a clock exist in mixed form, the effect of reducing radiant noise is not degraded.

According to the present invention as well, there can be provided a clock modulating circuit applicable even to an MCU or the like including a circuit dependent on a duty ratio.

What is claimed is:

1. A clock modulating circuit comprising:
   a first delay circuit receiving an original clock signal and outputting a delayed clock signal;
   a second to nth delay circuits each of which receives the delayed clock signal output from the preceding delay circuit and outputs a delayed clock signal;
   a selection signal generator outputting a selection signal in response to the original clock signal, the selection signal having an instruction for selecting in ascending order from the first to nth delay circuits and then in descending order from the nth to first delay circuits; and
   a selection circuit connected to the first to nth delay circuits and the selection signal generator, the selection circuit receiving delayed clock signals from the first to nth delay circuits and outputting one of the delayed clock signals in response to the selection signal.

2. A clock modulating circuit according to claim 1, wherein the first to nth delay circuits are connected in series.

3. A clock modulating circuit according to claim 1, wherein the selection signal generator is a counter.

4. A clock modulating circuit according to claim 3, wherein the counter includes a plurality of flip-flops.

5. A clock modulating circuit according to claim 3, wherein the counter is an up counter.

6. A clock modulating circuit according to claim 3, wherein the counter includes an up counter and a down counter.

7. A clock modulating circuit according to claim 1, wherein the selection circuit includes a plurality of gate circuits.

8. A clock modulating circuit comprising:
   a first to nth delay circuits connected in series, the first delay circuit receiving an original clock signal;
   a selection signal generator outputting a selection signal that indicates to select in ascending order from the first to nth delay circuits and then in descending order from the nth to first delay circuits in response to the original clock signal; and a selection circuit connected to the first to nth delay circuits and the selection signal generator, the selection circuit receiving signals from the first to nth delay circuits and outputting one of the received signals in response to the selection signal.

9. A clock modulating circuit according to claim 8, wherein the selection signal generator is a counter.

10. A clock modulating circuit according to claim 9, wherein the counter includes a plurality of flip-flops.

11. A clock modulating circuit according to claim 9, wherein the counter is an up counter.

12. A clock modulating circuit according to claim 9, wherein the counter includes an up counter and a down counter.

13. A clock modulating circuit according to claim 8, wherein the selection circuit includes a plurality of gate circuits.

14. A clock modulating circuit comprising:

a first to nth delay circuits connected in series, the first delay circuit receiving an original clock signal, each of the delay circuits outputting a delayed clock signal;

a selection signal generator outputting a selection signal that indicates to select in ascending order from the original clock signal, the delayed clock signals of the first to nth delay circuits and then in descending order from the delayed clock signals of the nth to first delay circuits and the original clock signal in response to the original clock signal; and a selection circuit connected to the first to nth delay circuits and the selection signal generator, the selection circuit receiving the original clock signal and the delayed clock signals from the first to nth delay circuits and outputting one of the original clock signal and the delayed clock signals in response to the selection signal.

15. A clock modulating circuit according to claim 14, wherein the selection signal generator is a counter.

16. A clock modulating circuit according to claim 15, wherein the counter includes a plurality of flip-flops.

17. A clock modulating circuit according to claim 15, wherein the counter is an up counter.

18. A clock modulating circuit according to claim 14, wherein the selection circuit includes a plurality of gate circuits.

* * * * *